United States Patent [19]

Iwahashi

[11] Patent Number: 4,845,680
[45] Date of Patent: Jul. 4, 1989

[54] NONVOLATILE SEMICONDUCTOR MEMORY DEVICE

[75] Inventor: Hiroshi Iwahashi, Yokohama, Japan

[73] Assignee: Kabushiki Kaisha Toshiba, Kawasaki, Japan

[21] Appl. No.: 218,490

[22] Filed: Jul. 6, 1988

Related U.S. Application Data

[63] Continuation of Ser. No. 940,005, Dec. 10, 1986, abandoned.

[30] Foreign Application Priority Data

Dec. 27, 1985 [JP] Japan ................................ 60-293151

[51] Int. Cl.$^4$ .............................................. G11C 11/40
[52] U.S. Cl. .................................................... 365/185
[58] Field of Search ............................... 365/185, 230

[56] References Cited

U.S. PATENT DOCUMENTS

| 4,520,466 | 5/1985 | Mashiko | 365/210 |
| 4,599,706 | 7/1986 | Gutterman | 365/185 |

*Primary Examiner*—James W. Moffitt
*Attorney, Agent, or Firm*—Finnegan, Henderson, Farabow, Garrett and Dunner

[57] ABSTRACT

A nonvolatile memory device includes first and second voltage lines whose potentials are selectively set, first and second gate control lines, first to third MOS transistors which are serially connected between the first and second voltage lines, the first and third MOS transistors having gates respectively connnected to the first and second gate control lines and the second MOS transistor having a gate set in an electrically floating conditions, first and second capacitors respectively connected between the gate of the second MOS transistor and the gates of the first and third MOS transistors, and third capacitor connected between the gate and drain of the second MOS transistor.

14 Claims, 8 Drawing Sheets

F I G. 6A
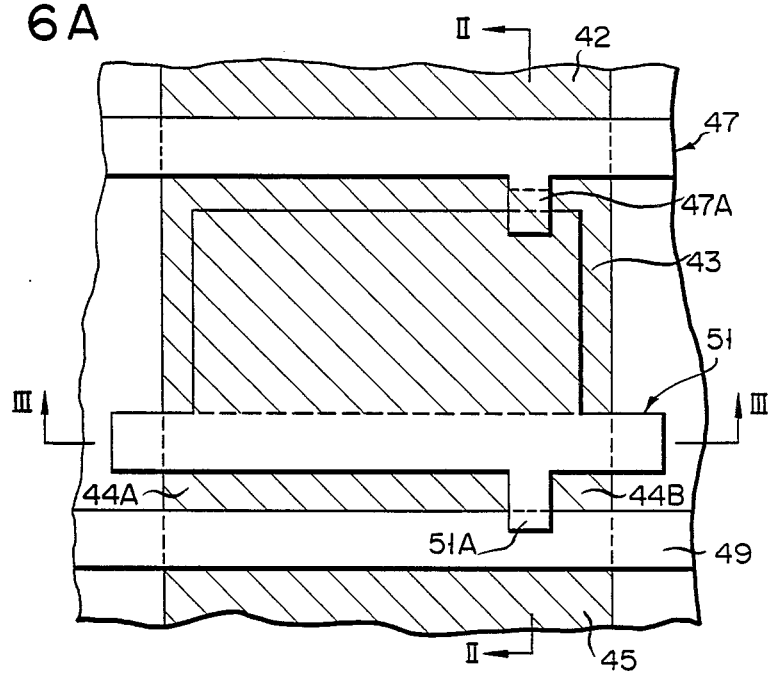
F I G. 6B
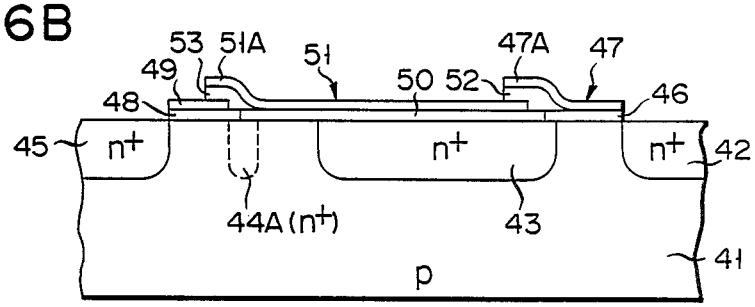
F I G. 6C
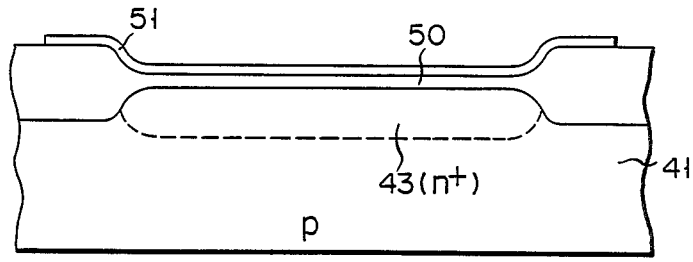

F I G. 14
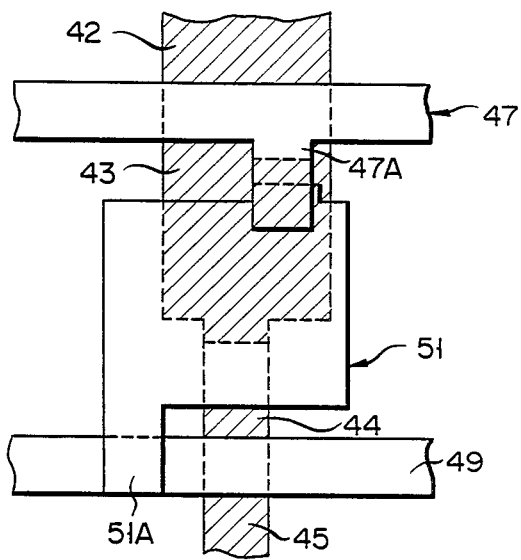
F I G. 15
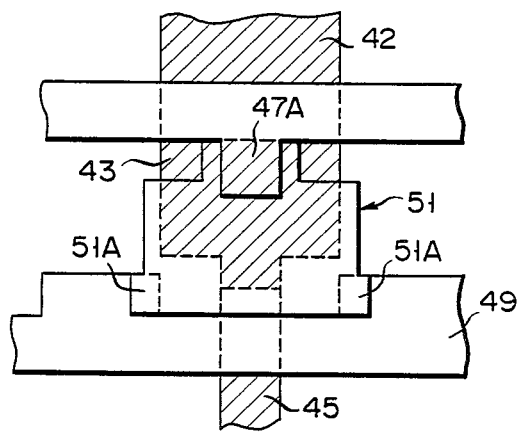

NONVOLATILE SEMICONDUCTOR MEMORY DEVICE

This application is a continuation of application Ser. No. 940,005, filed Dec. 10, 1986 now abandoned.

BACKGROUND OF THE INVENTION

The present invention relates to an electrically erasable and programmable nonvolatile semiconductor memory device.

In general, in an electrically erasable and programmable read only memory (EEPROM), it is known that data is programmed or erased by injecting electrons into a floating gate or emitting electrons from the floating gate through a thin silicon oxide film. For example, as shown in FIG. 1, a memory cell which is used in such a kind of EEPROM comprises: an MOS transistor 1 of a double gate structure which has a floating gate and a control gate and is used to store the data; and a selection MOS transistor 2 of an enhancement type connected in series with MOS transistor 1. The drain of selection MOS transistor 2 is connected to a column line 3. The source of MOS transistor 1 for data storage is, for example, grounded.

FIGS. 2A and 2B show an example of a memory cell device having such a constitution. FIG. 2A shows a plane pattern of the memory cell. FIG. 2B shows a cross sectional structure taken along the line I-I in FIG. 2A. In FIGS. 2A and 2B, n+-type semiconductor regions 12, 13, and 14 are separately formed in the surface area of a p-type silicon semiconductor substrate 11. Region 12 constitutes the wiring of column line 3 and the drain of selection MOS transistor 2. Region 13 constitutes the source of selection MOS transistor 2 and the drain of data storage MOS transistor 1. Further, region 14 constitutes the source of MOS transistor 1. A gate electrode 15 of MOS transistor 2 is constituted by a polycrystalline silicon layer doped with impurities and having a low resistance, and is formed over substrate 11 between regions 12 and 13 through a gate insulating film (not shown) so as to be elongated in the lateral direction. A floating gate electrode 16 of MOS transistor 1 which is constituted by a polycrystalline silicon layer doped with impurities and having a low resistance and which is held in an electrically floating condition is formed over substrate 11, between regions 13 and 14, through a gate insulating film (not shown). Further, a control gate electrode 17 of MOS transistor 1 which is constituted by a polycrystalline silicon layer, doped with impurities and having a low resistance, is formed over floating gate electrode 16 between regions 13 and 14, through a gate insulating film (not shown), so as to be elongated in the lateral direction. On the other hand, a projecting portion 13A of n+-type semiconductor region 13 and a projecting portion 16A of floating gate electrode 16 overlap through a thin insulating film 18 of about 100A.°

In the memory cell device having such a structure as shown in FIGS. 2A and 2B, to program data by injecting electrons into floating gate electrode 16 of transistor 1, control gate electrode 17 is set to a high potential, e.g., +20V. Thus, the potential of floating gate electrode 16 is raised by the capacitive coupling between the control gate and floating gate, the electric field between floating gate electrode 16 and n+-type semiconductor region 13 increases, and the electrons are injected into floating gate electrode 16 through thin insulating film 18. Therefore, the threshold voltage of MOS transistor 1 increases.

On the contrary, to erase the data, namely, to release the electrons captured in floating gate electrode 16, control gate electrode 17 is set to a low potential, for example, a ground potential of 0 V and at the same time, gate electrode 15 and n+-type semiconductor region 12 of MOS transistor 2 are set to high potentials. Therefore, MOS transistor 2 is turned on, n+-type semiconductor region 13 becomes high potential, and the electric field between projecting portion 16A of floating gate electrode 16 and projecting portion 13A of n+-type semiconductor region 13 increases in the direction opposite to that when the data is programmed. Consequently, the electrons are emitted from floating gate electrode 16 through thin insulating film 18 and the threshold voltage of MOS transistor 1 decreases.

FIG. 3 is a graph of characteristic curves showing the relation between a control gate voltage VCG and a drain current ID of MOS transistor 1 in the memory cell shown in FIG. 1. In the graph, a curve 21 shows the characteristic of the initial state in which the data is not programmed. Curve 22 shows the characteristic after the data was programmed by injecting the electrons into the floating gate electrode. A curve 23 shows the characteristic after the data was erased by emitting the electrons from the floating gate electrode. In such a memory cell, by programming or erasing the data, the MOS transistor having the initial characteristic of curve 21 in FIG. 3 may be changed to have the characteristic of curve 22 or 23.

FIG. 4 shows a memory cell array which is constituted by arranging the foregoing conventional EEPROM cells in a matrix form. Namely, a plurality of EEPROM cells MC-11 to MC-MN are arranged in a matrix form in the row and column directions. The gate electrodes of MOS transistors 2 of a plurality of memory cells which lie on the same row among memory cells MC-11 to MC-MN are commonly connected to a corresponding one of a plurality of row lines 31-1 to 31-M. Further, the control gate electrodes of MOS transistors 1 of a plurality of memory cells which lie on the same row are commonly connected to a corresponding one of a plurality of control gate lines 32-1 to 32-M. The drains of transistors 2 of a plurality of memory cells which lie on the same column are commonly connected to a corresponding one of a plurality of column lines 33-1 to 33-N.

The data programming and erasing operations of the memory having such a memory cell array will now be described with reference to a timing chart in FIG. 5. It is now assumed that, for example, the data is programmed into memory cell MC-11, connected to row line 31-1 and column line 33-1, and that the data is erased from memory cell MC-12, connected to row line 31-1 and column line 33-2. First, as shown in FIG. 5, row line 31-1 is selected and set to a high potential. Simultaneously, control gate line 32-1 of the row corresponding to row line 31-1 is also set to a high potential. At this time, two column lines 33-1 and 33-2 are set to a low potential, irrespective of the data programming and erasing operations. In two memory cells, MC-11 and MC-12 in this case, the electrons, are injected into the floating gate electrodes, as mentioned above. Thereafter, control gate line 32-1 is returned to a low potential and column line 33-2 is further set to a high potential. Thus, in memory cell MC-12, connected to row line 31-1 and column line 33-2, the electrons are emitted from the floating gate electrode, as mentioned above, and the data is erased. In this manner, the data is programmed and erased in memory cells MC-11 and MC-12, respectively.

However, as will be obvious from the above description, in the memory cell array using the conventional EEPROM cells, both the data programming period and the data erasing period are separately necessary. In other words, the electrons cannot be simultaneously injected and emitted into and from the floating gate electrodes of different memory cells, so that there is a drawback, in that it takes a long time to rewrite the data.

In addition, in such a memory cell, the charging and discharging of the floating gate is accomplished by Flowler-Nordheim tunneling of electron across the thin insulating film 18, thereby allowing the data to be programmed or erased. Therefore, the electrons pass through insulating film 18 (FIG. 2B) and are trapped into insulating film 18, causing the insulation performance of insulating film 18 to deteriorate. Therefore, in the ordinary EEPROM, the number of data rewriting times of only about $10^4$ to $10^5$ is assured. However, according to the memory cells of the conventional structure, when arranged in a matrix form to constitute an integrated circuit, the control gate electrodes (gates 17 in FIGS. 2A and 2B) need to be commonly used for every row line. Therefore, in the case of programming and erasing the data, the data will be also once programmed into the memory cell from which the data should be erased, by releasing the electrons therefrom. Namely, the process to inject the electrons before the electrons are emitted certainly exists. Therefore, in the worst case, when the data is once rewritten, the electrons pass through insulating film 18 twice. If the number of times of passage of the electrons in insulating film 18 can be reduced to one, the number of writable times of the data will be doubled.

SUMMARY OF THE INVENTION

It is an object of the present invention to provide a nonvolatile semiconductor memory device which can promptly and efficiently program data.

This object is accomplished by a nonvolatile semiconductor memory device comprising: first, second, and third MOS transistors which are serially connected, the gates of the first and third MOS transistors being respectively connected to first and second gate control lines and the gate of the second MOS transistor being held in a floating condition; first and second capacitors which are respectively connected between the gate of the second MOS transistor and the gates of the first and third MOS transistors; and a third capacitor connected between the gate and drain of the second MOS transistor.

In this invention, by setting the drain of the first MOS transistor and the second gate control line to a low potential, and also by setting the first gate control line to a high potential, the charges are transferred from the gate of the second MOS transistor to the gate of the first MOS transistor. By setting the drain and gate of the first MOS transistor to a high potential and by setting the gate of the third MOS transistor to a low potential, the charges ca be transferred from the gate of the third MOS transistor to the gate of the second MOS transistor. In this case, the gate of the first MOS transistor, which is connected to the row line, is always held at a high potential and the injection and emission of the electrons are individually programmed by the data to be supplied to the drain of the first MOS transistor, so that the data can be simultaneously programmed.

BRIEF DESCRIPTION OF THE DRAWINGS

FIGS. 6A to 6C show a plane pattern and cross-sectional structure of a nonvolatile memory according to an embodiment of the present invention;

FIGS. 12 to 15 show plane patterns of nonvolatile semiconductor memories according to other embodiments of the invention.

DETAILED DESCRIPTION OF THE PREFERRED EMBODIMENTS

Figure 1:
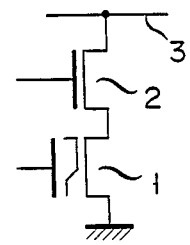
FIG. 1 is a circuit diagram of a conventional nonvolatile memory.
Figure 2A:
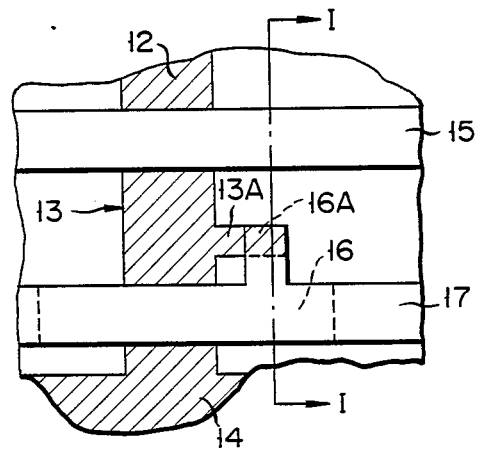
FIGS. 2A and 2B show a plane pattern and a cross sectional structure of a conventional nonvolatile memory.
Figure 2B:
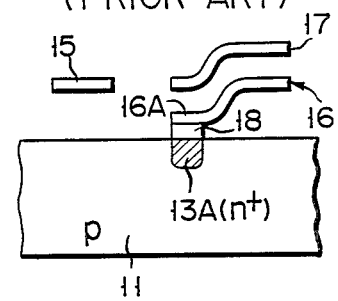
Figure 3:
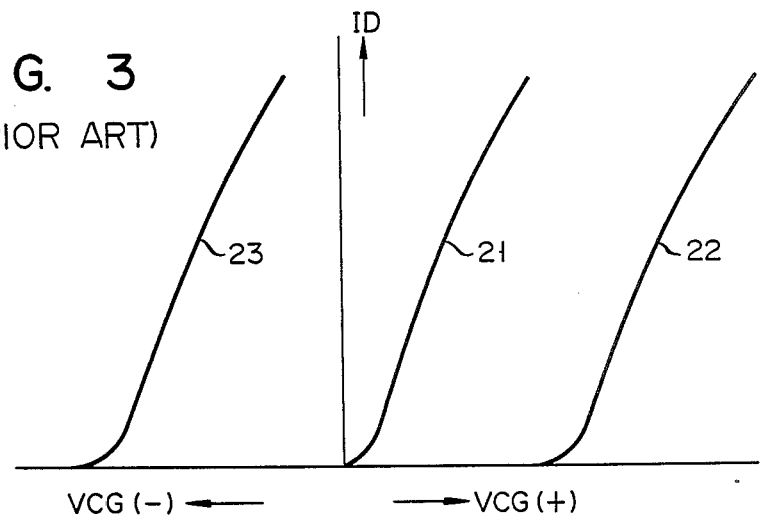
FIG. 3 is a characteristic diagram of the nonvolatile memory shown in FIGS. 2A and 2B.
Figure 4:
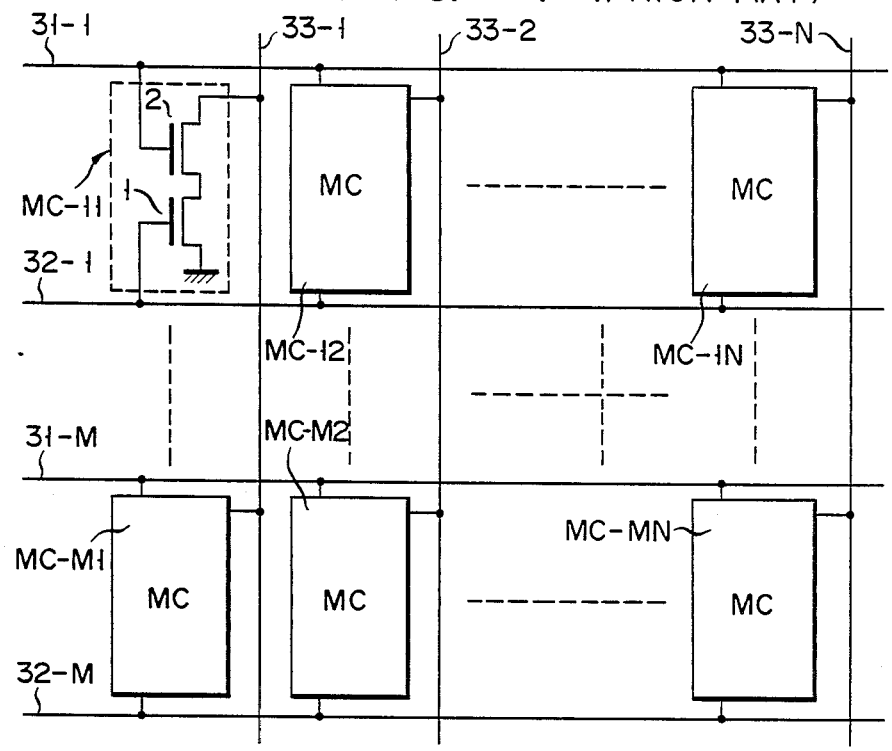
FIG. 4 shows a memory cell array which is constituted by using a plurality of memory cells having the same structure as the nonvolatile memory shown in FIG. 1.
Figure 5:
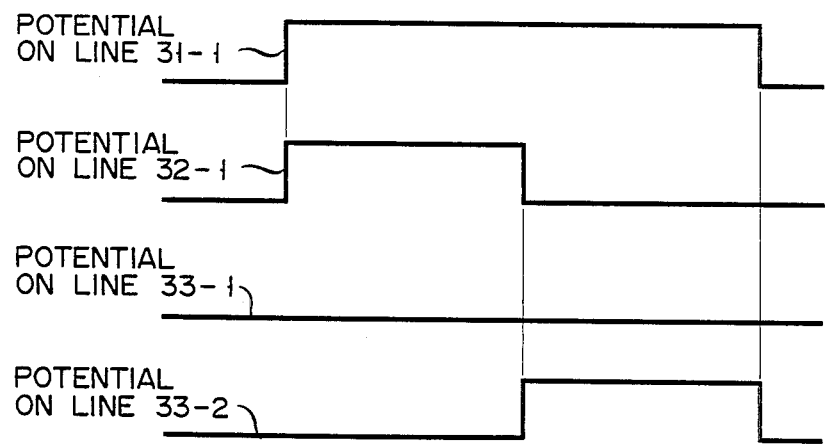
FIG. 5 is a voltage waveform diagram for explaining the operation of the memory cell array shown in FIG. 4.

An embodiment of the present invention will be described hereinbelow with reference to the drawings.

FIGS. 6A to 6C illustrate a constitution of a memory cell for use in a nonvolatile semiconductor memory according to the invention. FIG. 6A is a pattern plan view. FIG. 6B is a cross sectional view taken along the line II—II in FIG. 6A. FIG. 6C is a cross-sectional view taken along the line III—III in FIG. 6A. n+-type regions 42, 43, 44A, 44B, and 45 are separately formed in the surface are of a p-type silicon substrate 41, respectively. In FIG. 6A, to clearly show n+-type regions 42, 43, 44A, 44B, and 45, these regions are shown as hatched areas. A polycrystalline silicon layer 47, into which impurities are doped and whose resistance is low, is formed over substrate 41 between regions 42 and 43 through a gate insulating film 46, so as to extend in the lateral direction. A polycrystalline silicon layer 49, into which impurities are doped and whose resistance is low, is formed over substrate 41 between regions 44A, 44B, and 45 through a gate insulating film 48, so as to extend in the lateral direction. Further, a polycrystalline silicon layer 51, which is held in an electrically floating condition, is integrally formed over substrate 41 among regions 43, 44A, and 44B and over n+-type region 43 through a gate insulating film 50.

Further, a projecting portion 47A of polycrystalline silicon layer 47 overlaps polycrystalline silicon layer 51 through an insulating film 52. A projecting portion 51A of layer 51 also overlaps layer 49 through an insulating film 53.

Figure 7:
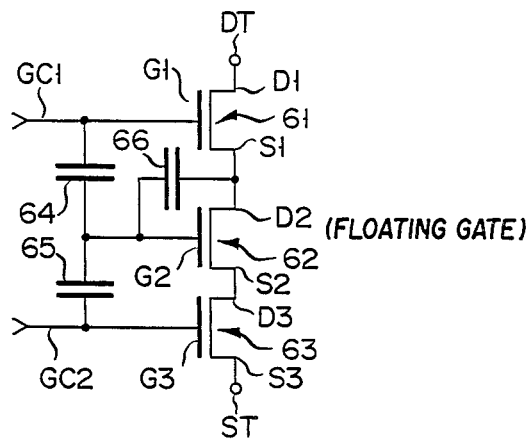
FIG. 7 is an equivalent circuit diagram of the memory shown in FIGS. 6A to 6C.

FIG. 7 shows an equivalent circuit of the memory cell shown in FIGS. 6A to 6C. In FIG. 7, in MOS transistor 61 of an enhancement type, a drain $D_1$ is constituted by n+-type region 42, a source $S_1$ is constituted by n -type region n+-type region 43, and a gate electrode $G_1$ and a gate control line $GC_1$ are constituted by polycrystalline silicon layer 47, respectively. In MOS transistor 62, a drain $D_2$ is constituted by n+-type region 43, a source $S_2$ is constituted by n+-type regions 44A and 44B, and a gate electrode $G_2$ is constituted by polycrystalline silicon layer 51, respectively. However, in MOS transistor 62, polycrystalline silicon layer 51 is set in an electrically floating condition and gate electrode $G_2$ functions as what is called a floating gate electrode. In MOS transistor 63 of an enhancement type, a drain $D_3$ is constituted by n+-type regions 44A and 44B, a source $S_3$ is constituted by n+-type region 45, and a gate electrode $G_3$ and a gate control line $GC_2$ are constituted by polycrystalline silicon layer 49, respectively. Further, a capacitor 64 which is constituted in the overlapping portions between projecting portion 47A of polycrystalline silicon layer 47 and polycrystalline silicon layer 51 is connected between gate electrode $G_1$ of transistor 61 and a floating gate electrode $G_2$ of MOS transistor 62. Similarly, a capacitor 65 which is constituted in the overlapping portions between projecting portion 51A of polycrystalline silicon layer 51 and polycrystalline silicon layer 49 is connected between floating gate electrode $G_2$ of MOS transistor 62 and gate electrode $G_3$ of MOS transistor 63. Further, since polysilicon layer 51 is also formed over n+-type region 43 serving as drain $D_2$ of transistor 62, a capacitor 66 which is constituted in the overlapping portions between layer 51 and n+-type region 43 is connected between floating gate electrode $G_2$ of MOS transistor 62 and drain $D_2$. n+-type regions 42 and 45 are also used as the wirings.

As described above, the memory cell shown in FIGS. 6A to 6C is constituted by: a series circuit of three MOS transistors 61 to 63 which are serially connected between a drain terminal DT and a source terminal ST; and three capacitors 64 to 66. n+-type regions 44A and 44B which constitute source $S_2$ of MOS transistor 62 and drain $D_3$ of MOS transistor 63 are separated into two regions. However, for example, by forming projecting portion 51A so as to overlap polycrystalline silicon layer 49 out of the range of n+-type regions 44A and 44B, those two regions 44A and 44B can be constituted as one region.

The reading, programming, and erasing operations of the data in the memory cell having such a constitution as mentioned above will now be described. First, in the case of executing the reading operation of the data, gate electrode $G_1$ of MOS transistor 61 and gate electrode $G_3$ of MOS transistor 63 are set to a "1" level through gate control lines $GC_1$ and $GC_2$, respectively. Thus, MOS transistors 61 and 63 are turned on. Namely, in FIG. 6B, inverted layers are formed in the surface area of substrate 41 below polycrystalline silicon layers 47 and 49. It is now assumed that the electrons are previously injected into floating gate electrode $G_2$ of MOS transistor 62 and the threshold voltage of MOS transistor 62 is set to a high voltage. In this case, no inverted layer is formed in the surface area of substrate 41 among n+-type regions 43, 44A, and 44B below floating gate electrode $G_2$ of transistor 62, namely, below polycrystalline silicon layer 51. Therefore, MOS transistor 62 is held in the OFF state, so that a path for a current which will flow through MOS transistors 61 to 63 cannot be formed. In this case, since the drain potential of MOS transistor 61 is previously set to a "1" level, the "1" level is derived as the read data.

On the other hand, in the case where the electrons are preliminarily emitted from floating gate electrode $G_2$ of MOS transistor 62 when the data is read out, floating gate electrode $G_2$ of MOS transistor 62 is charged to the positive polarity and the threshold voltage is set to a low value. Thus, MOS transistor 62 is in the ON state in the reading mode. Therefore, in this case, a path for a current which will flow through MOS transistors 61 to 63 can be formed. By previously setting the drain potential of MOS transistor 61 to a "1" level and the source potential of MOS transistor 63 to the ground potential (0 V), respectively, the "1" level voltage on drain $D_1$ of MOS transistor 61 is discharged to the ground through MOS transistors 61 to 63, so that the "0" level (ground potential) is derived as the read data.

The programming or erasing operation of the data into or from the memory cell is executed by injecting the electrons into floating gate electrode $G_2$ of MOS transistor 62 or emitting the electrons from floating gate electrode $G_2$. The injection and emission of the electrons are performed by properly setting the potential of drain D1 of MOS transistor 61, namely, n+-type region 42 in FIG. 6A under the condition in which gate electrode $G_1$ of MOS transistor 61 is held at a high potential and gate electrode $G_3$ of MOS transistor 63 is held at 0V, respectively.

For example, to emit the electrons from gate electrode $G_2$, n+-type region 42 is set to 0V. It is now assumed that gate electrode $G_1$ of MOS transistor 61 is set to a high potential due to the capacitive coupling by capacitor 64, so that the potential of floating gate electrode $G_2$ of MOS transistor 62 intends to increase. However, since the capacitive coupling between gate electrodes $G_1$ and $G_2$ by capacitor 64 is small, an increase in potential of floating gate electrode $G_2$ is extremely small. Therefore, a large potential difference occurs between gate electrodes $G_1$ and $G_2$ and the electric field between projecting portion 47A of silicon layer 47 and silicon layer 51 is enhanced, thereby allowing the electrons to be emitted from floating gate electrode $G_2$ into gate electrode $G_1$.

On the other hand, in the case of injecting the electrons into gate electrode $G_2$, n+-type region 42 or drain $D_1$ is set to a high potential. Then, the high potential of region 42 is transferred to drain $D_2$ of MOS transistor 62 through MOS transistor 61 which is in the ON state. Further, the potential of floating gate electrode $G_2$ of MOS transistor 62 increases through capacitor 66 by the capacitive coupling. Thus, the electric field between projecting portion 47A of polysilicon layer 47 and polysilicon layer 51 decreases. However, the electric field between projecting portion 51A of polysilicon layer 51 and polysilicon layer 49 enlarges, thereby allowing the electrons to be injected from gate electrode $G_3$ into floating gate electrode $G_2$ In the memory cell, by selectively setting the potential of drain $D_1$ of MOS transistor 61 to either a high potential or a low potential as described above, electrons can be transferred or received in floating gate electrode $G_2$. Therefore, when a plurality of memory cells are arranged in a matrix form to constitute an integrated circuit, the electrons can be simultaneously injected into and emitted from a plurality of memory cells which lie on the same row.

Figure 8:
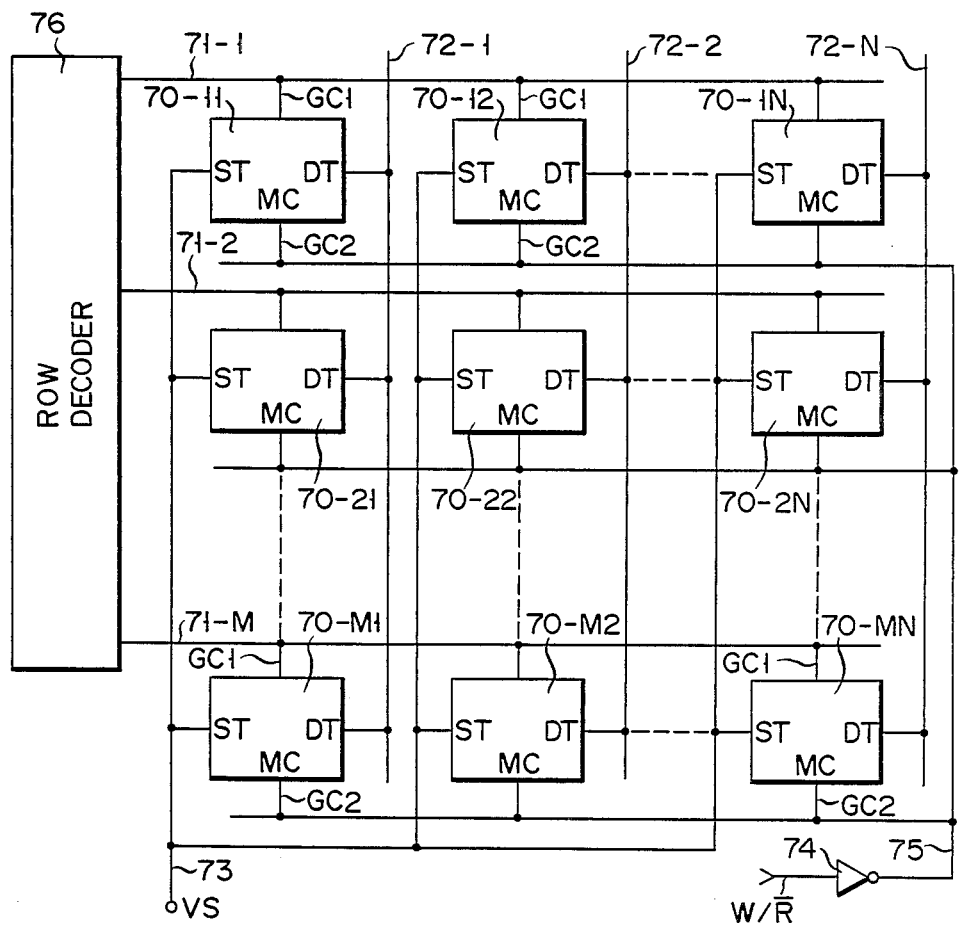
FIG. 8 is a circuit diagram of a memory which is constituted by using a plurality of memory cells having the same structure as the memory shown in FIGS. 6A to 6C and 7.

FIG. 8 is a block diagram of a memory having a memory cell array which is constituted by using a plurality of memory cells shown in FIG. 7. In FIG. 8, memory cells 70-11 to 70-MN are constituted in a manner similar to the memory cell comprising three MOS transistors 61 to 63 and three capacitors 64 to 66, as shown in FIG. 7, respectively. Those memory cells 70-11 to 70-MN are arranged in a matrix form in the row and column directions. Gate electrodes $G_1$, among a plurality of cells arranged on the same row, are commonly connected to a corresponding one of a plurality of row lines 71-1 to 71-M. Drains $D_1$ of MOS transistors 61 among a plurality of cells arranged on the same column are commonly connected to a corresponding one of a plurality of column lines 72-1 to 72-N. Sources $S_3$ of MOS transistors 63 of all memory cells 70-11 to 70-MN are connected to a common source line 73 to which a predetermined potential VS is applied. Further, gate electrodes $G_3$ of MOS transistors 63 of all memory cells 70-11 to 70-MN are connected to an output line 75 of an inverter 74 for inverting a control signal $W/\overline{R}$ which is set to a "0" level when the data is read out and to a "1" level when the data is programmed and erased. Decoded outputs from a line decoder 76 are supplied to row lines 71-1 to 71-M, respectively.

The reading operation of the data from the memory having such a memory cell array will now be described. First, potential VS of common source line 73 is set to 0V and signal $W/\overline{R}$ is set to a "0" level (0V). The potential of output line 75 is set to a "1" level and the potentials of gate electrodes $G_3$ of MOS transistors 63 among memory cells 70-11 to 70-MN are each set to a "1" level. One of row lines 71-1 to 71-M which was selected by row decoder 76 is set to a "1" level potential. Thus, the data is read out in a manner similar to the operation described for the circuit shown in FIG. 7, in accordance with whether or not the electrons have been charged into floating gate electrode $G_2$ in a memory cell connected to both of the selected row and column lines.

Figure 9A:
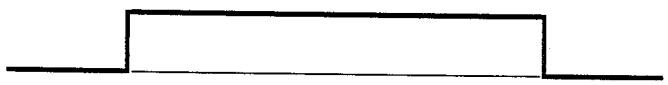
FIGS. 9A to 9D are voltage waveform diagrams for explaining the operation of the memory circuit in FIG. 8.
Figure 9B:
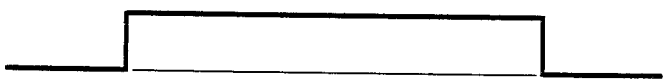
Figure 9C:
Figure 9D:

The data programming and erasing operations of the memory having such a memory cell array will now be described with reference to timing charts in FIGS. 9A to 9D. Potential VS of common source line 73 may be set to an arbitrary potential. First, control signal $W/\overline{R}$ is set to a "1" level and the output signal of inverter 74 is set to a "0" level. Only the row line connected to the memory cell into which or from which the electrons are intended to be injected or emitted, for example, only row line 71-1, is set to a high potential, as shown in FIG. 9A. Further, for example, in the case of emitting the electrons from memory cell 70-12 and injecting the electrons into memory cell 70-11, the potential of column line 72-2 connected to memory cell 70-12 is held at 0V as shown in FIG. 9C and the potential of column line 72-1 connected to memory cell 70-11 is set to a high potential as shown in FIG. 9B. Thus, as previously described with respect to the operation of the equivalent circuit in FIG. 7, the electrons are emitted from or injected into the selected memory cells and the data is programmed into and erased from the selected memory cells in parallel, namely, simultaneously. Therefore, there is no need to independently provide the programming period and erasing period of data, as in the conventional device. Thus, the time which is required to rewrite data can be reduced. Further, even if data is simultaneously programmed into and erased from different memory cells, the electrons pass through each of gate insulating films 46 and 48, shown in FIG. 6B, in one memory cell only once each time the data is rewritten. Consequently, the number of times the data can be rewritten is increased to double that of the conventional memory.

Figure 10:
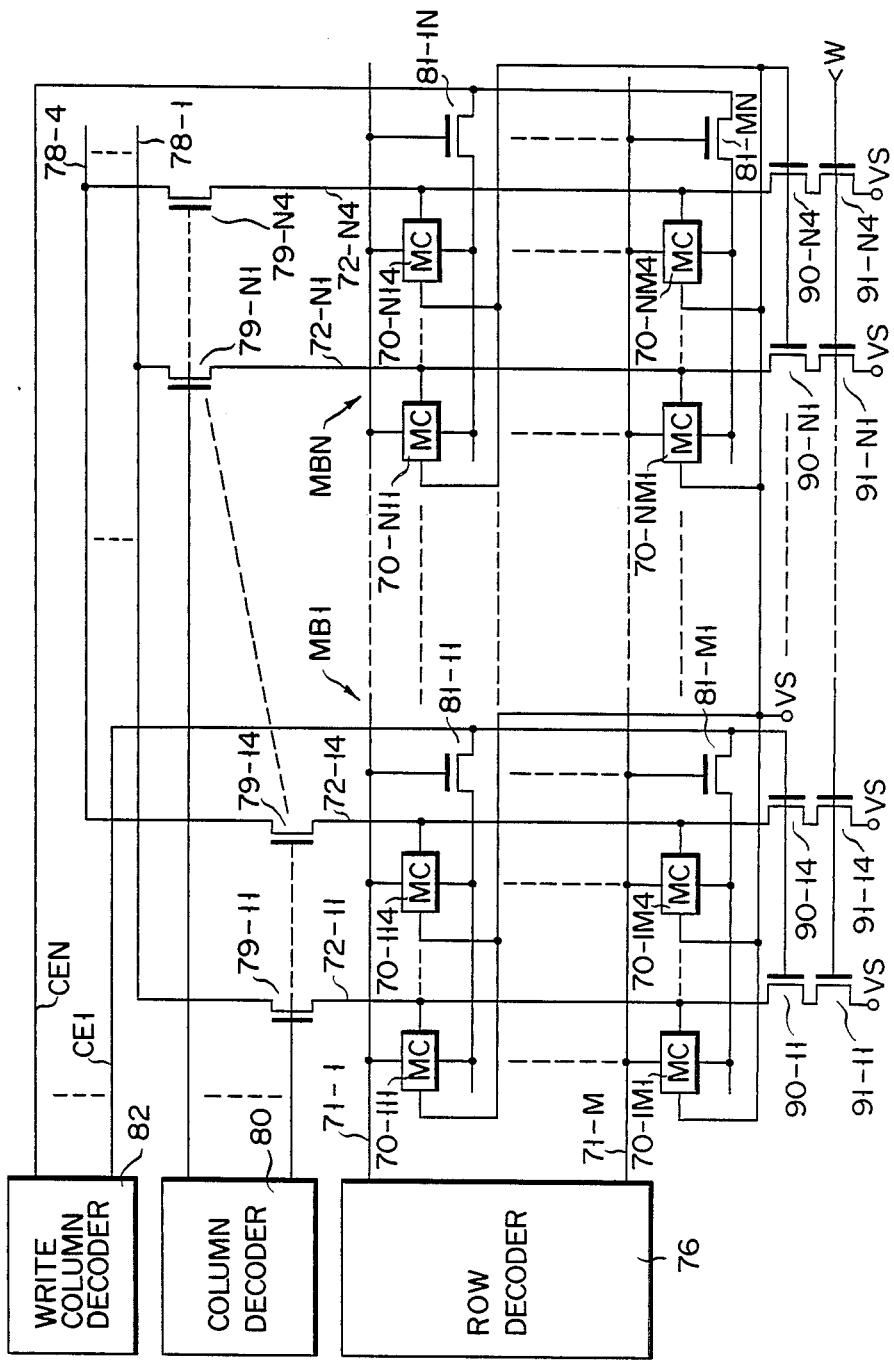
FIG. 10 is a circuit diagram of a memory which is constituted by using a plurality of memory cells having the same structure as the memory shown in FIGS. 6A to 6C and 7.

FIG. 10 is a block diagram of a memory which is different from the memory shown in FIG. 8 and has a memory cell array which is constituted by using a plurality of memory cells 70-111 to 70-NM4, each of which is constituted similarly to the memory cell shown in FIG. 7. This memory is constituted as a four-bit memory which handles the data on a four-bit unit basis. In FIG. 10, the memory cell array is divided into N memory blocks MB1 to MBN each having (4×M) memory cells. Gate electrodes $G_1$ (refer to FIG. 7) of four memory cells which lie on the same row of each of memory blocks MB1 to MBN are commonly connected to one of a plurality of row lines 71-1 to 71-M. On the other hand, drains $D_1$ (refer to FIG. 7) of MOS transistors 61 in M memory cells which lie on the same column are connected to one of four column lines 72-11 to 72-14; . . . ; or 72-N1 to 72-N4 in the same memory block.

Column lines 72-11 to 72-14; . . . ; and 72-N1 to 72-N4 of the memory blocks are connected to four data input/output lines 78-1 to 78-4 through MOS transistors 79-11 to 79-14; . . . ; and 79-N1 to 79-N4 for selecting the column lines, respectively. One of N decoding output lines of a column decoder 80 is commonly connected to the respective gate electrodes of the transistors connected to the same memory block among MOS transistors 79-11 to 79-14; . . . ; and 79-11 to 79-N4.

Gate electrodes $G_3$ in four cells which lie on the same row in each of the memory blocks are commonly connected to one terminal of one of MOS transistors 81-11 to 81-Ml; . . . ; and 81-lN to 81-MN. The gate electrodes of MOS transistors 81-11 to 81-Ml; . . . ; 81-lN to 81-MN are selectively connected to corresponding row lines 71-1 to 71-M. The other ends are commonly connected to one of N decoding output lines of a write column decoder 82 for every memory block. Sources $S_3$ of all memory cells 70-111 to 70-NM4 are commonly connected to common source terminal VS.

Further, the column lines are respectively connected to common source terminal VS through two MOS transistors 90-11, 91-11; . . . ; and 90-N1, 91-N4 which are serially connected. The gates of MOS transistors 90-11, . . . , and 90-N1 are commonly connected for every memory block. The gates are connected to the decoding output lines from corresponding write column decoder 82. On the other hand, the gates of MOS transistors 91-11, . . . , and 91-N1 are all commonly connected and are supplied with a signal W which is set to a "1" level upon programming and erasing.

The data reading, programming, and erasing operations of the memory having such a constitution as mentioned above will now be described. First, when the data is read out, the selected one of row lines 71-1 to 71-M is set to a "1" level. In this case, all of the decoder output signals $CE_i$ (i=1, 2, . . .) of write column decoder 82 are at a "1" level. The potential of common source terminal VS is at a "0" level. Therefore, when row line 71-j becomes a "1" level, MOS transistors 81-j1 to 81- jN, connected to selected row line 71-j, are turned on. In this case, since decoder output signals $CE_i$ of write column decoder 82 are at a "1" level, MOS transistors 61 and 63 (FIG. 7) in each memory cell connected to selected row line 71-j are turned on. Data corresponding to the charging or discharging of floating gate electrodes $G_2$ of four memory cells in each memory block connected to selected row line 71-j is read out on four column lines in each memory block. Memory blocks MB1 to MB4 are selected by column decoder 80 and column line selection transistors 79-11 to 79-14; . . . ; and 79-N1 to 79-N4. Four memory data in the selected memory blocks are read out in parallel on four data input/output lines 78-1 to 78-4.

Figure 11A:
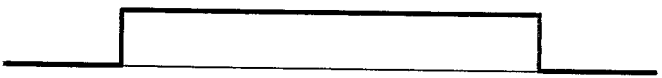
FIGS. 11A to 11E are voltage waveform diagrams for explaining the operation of the memory circuit in FIG. 10.
Figure 11B:
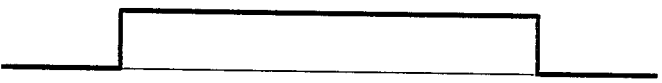
Figure 11C:
Figure 11D:
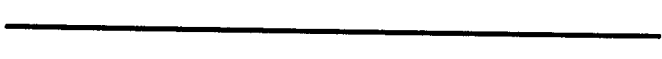
Figure 11E:
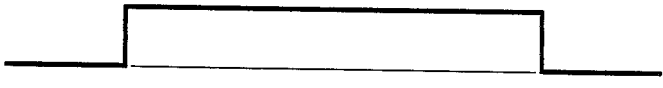

The programming and erasing operations of the data will now be described with reference to timing charts shown in FIGS. 11A to 11F. It is now assumed that, for example, the data is programmed into memory cell 70-111 and the data in memory cell 70-114 is erased. First, common source terminal VS and signal W are set to high potentials. As shown in FIG. 11A, only selected row line 71-1 is set to a "1" level. At this time, when decoder output signal $CE_1$ of write column decoder 82 is selected, signal $CE_1$ is held at a "0" level as shown in FIG. 11D and all of the nonselected decoder output signals other than selected signal $CE_1$ are set to a "1" level as shown in FIG. 11E. In this case, since the potential of row line 71-1 is at a "1" level, the potentials of respective gate electrodes $G_1$ of four memory cells 70-111 to 70-114; . . . ; and 70-N11 to 70-N14 in each memory block connected to row line 71-1 are set to a "1" level, so that each MOS transistor 61 (shown in FIG. 7) in these memory cells is turned on. Thus, 0V of decoder output signal $CE_1$ of write column decoder 82 is supplied to each of gate electrodes $G_3$ of four memory cells 70-111 to 70-114 in memory block MB1 through MOS transistors 81-11 to 81-1N. Therefore, in four memory cells 70-111 to 70-114, the data is programmed or erased on the basis of the potentials of column lines 72-11 to 72-14 which were supplied to data input/output lines 78-1 to 78-4 and set through MOS transistors 79-11 to 79-14 to select the column lines, respectively, as previously explained. For example, if column lines 72-11 and 72-14 are respectively set to a "1" level and a "0" level as shown in FIGS. 11B and 11C, the data will be programmed into memory cell 70-111 and the data will be erased from the memory cell 70-114. In this case, since signal $CE_1$ is at a "0" level, MOS transistors 90-11 and 90-14 are in the OFF state.

On the other hand, with respect to the other memory block connected to same row line 71-1, for example, memory block MBN, row line 71-1 is at a high potential of a "1" level. However, the decoding output signal of write column decoder 82, e.g., $CE_N$ is also at a high potential of a "1" level. Therefore, gate electrodes $G_3$ of memory cells 70-N11 to 70-N14 are also at a "1" level. Thus, MOS transistors 61 and 63 in each of memory cells 70-N11 to 70-N14 are in the ON state. In addition, at this time, common source terminal VS is at a high potential. However, transistors 79-N1 to 79-N4 are in the OFF state by the decoding output signal of column decoder 80. Therefore, column lines 72-N1 to 72-N4 are charged from common source terminal VS through transistors 90-N1 and 91-N1; . . . ; and 90-N4 and 91-N4, respectively. Thus, the potential of floating gate electrode $G_2$ of each of these MOS transistors also increases by the capacitive coupling with drain $D_2$ and the electric fields between gate electrodes $G_1$ and $G_2$ and between gate electrodes $G_2$ and $G_3$ are reduced, so that no electron is injected or removed.

Figure 12:
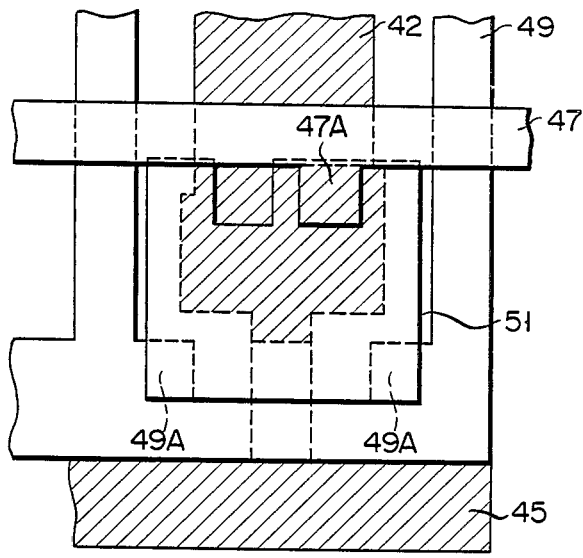
Figure 13:
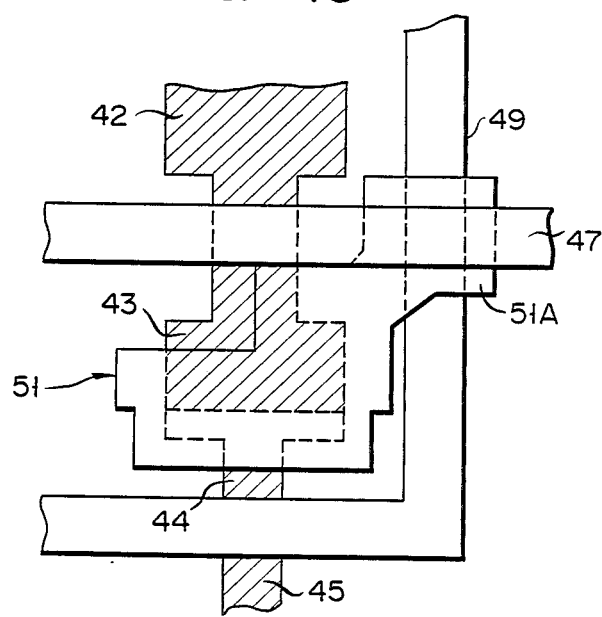

FIGS. 12 to 14 show plane patterns of memories which constitute the memory circuit shown in FIG. 7 in a manner similar to the plane pattern shown in FIG. 6A.

In FIG. 12, gate electrode 49 has two step portions 49A which are extended below a part of gate electrode 51 and formed so as to constitute capacitor 65. Gate electrode 47 is formed so as to have projecting portion 47A which overlaps a part of gate electrode 51 and constitutes capacitor 64. Further, in this example, regions 44A and 44B are omitted and the channel regions of MOS transistors 61 and 62 are directly connected.

In FIG. 13, gate electrodes 47 and 49 are arranged so as to cross each other and gate electrode 51 has projecting portion 51A arranged between gate electrodes 47 and 49 in the crossing portion of gate electrodes 47 and 49. Thus, capacitors are formed among gate electrodes 51, 47, and 49. A single region 44 is formed in place of regions 44A and 44B.

In FIG. 14, projecting portion 51A of gate electrode 51 is formed so as to overlap a part of gate electrode 49 without dividing $n^+$-type region 44.

In FIG. 15, gate electrode 51 is formed so as to have two projecting portions 51A which are formed so as to partially overlap gate electrode 49. In this example, regions 44A and 44B are omitted and the channel regions of MOS transistors 62 and 63 are directly connected.

What is claimed is:

1. A nonvolatile memory device comprising:
   row decoding means;
   first and second column decoding means;
   M row lines connected to said row decoding means;
   N column selection lines connected to said first column decoding means;
   N column control lines connected to said second column decoding means;
   N data transfer lines;
   a source line;
   N memory blocks each including n column lines, n switching means which are respectively connected between said n data transfer lines and said n column lines and whose control terminals are commonly connected to a corresponding one of said N column selection lines, M gate control lines, M second switching circuits which are respectively connected between a corresponding one of said N column control lines and said M gate control lines and whose control terminals are respectively connected to said M row lines, n series circuit which are respectively connected between said source line and said n column lines and each of which includes first MOS transistor having a gate connected to the corresponding one of said column control lines and a second MOS transistor serially connected with said first MOS transistor and having a gate connected to receive a control signal, and memory cells arranged in a matrix form, those of said memory cells which lie on the same row being connected to a corresponding one of said M row lines and to a corresponding one of said M gate control lines, and those of said memory cells which lie on the same column being connected to a corresponding one of said n column lines, and each of said memory cells including,
   first, second and third MOS transistors which are serially connected between the corresponding one of said column lines and said source line, said first and third MOS transistors having gates respectively connected to the corresponding one of said row lines and the corresponding one of said gate control lines and said second MOS transistor having a gate set in an electrically floating condition, first and second capacitive means respectively connected between the gate of said second MOS transistor and the gates of said first and third MOS transistors, and third capacitive means connected between the gate and drain of said second MOS transistor.

2. A memory device according to claim 1, wherein said row line and the gate of said first MOS transistor are formed of a first conductive layer, the gate of said second MOS transistor is formed of a second conductive layer, and said gate control line and the gate of said third MOS transistor are formed of a third conductive layer.

3. A memory device according to claim 2, wherein said first and second conductive layers have overlapping portions which constitute said first capacitive means, and said second and third conductive layers have overlapping portions constitute said second capacitive means.

4. A memory device according to claim 3, wherein a source region of said first MOS transistor and a drain region of said second MOS transistor are formed of the same semiconductor region, and said second conductive layer is formed to overlap said semiconductor region, constituting said third capacitive means.

5. A memory device according to claim 4, wherein each of said first, second and third conductive layers is formed of polycrystalline silicon.

6. A memory device according to claim 2, wherein each of said first, second and third conductive layers is formed of polycrystalline silicon.

7. A memory device according to claim 2, wherein said second conductive layer has a portion disposed between said first and third conductive layers.

8. A nonvolatile memory device comprising:
first and second voltage lines each having a selectively set potential;
first and second gate control lines;
first, second and third MOS transistors serially connected between said first and second voltage lines, said first and third MOS transistors each having gates respectively connected to said first and second gate control lines and said second MOS transistor having a gate set in an electrically floating condition;
first and second capacitive means respectively connected between the gate of said second MOS transistor and the gates of said first and third MOS transistors; and
third capacitive means connected between the gate and drain of said second MOS transistor;
wherein said first gate control line and the gate of said first MOS transistor are formed of a first conductive layer (47), the gate of said second MOS transistor is formed of a second conductive layer (51) and said second gate control line and the gate of said third MOS transistor are formed of a third conductive layer (49);
and wherein said first conductive layer (47) includes at least one projection portion (47A) overlapping a part of said second conductive layer (51) to form said first capacitive means (64), and said third conductive layer (49) includes at least one step portion (49A) extending below a part of said second conductive layer (51) to form said second capacitive means (65).

9. A nonvolatile memory device according to claim 8, wherein a source region of said first MOS transistor and a rain region of said second MOS transistor are formed of the same semiconductor region, said second conductive layer overlapping said semiconductor region to form said third capacitive means (66).

10. A nonvolatile memory device according to claim 9, wherein each of said first, second, and third conductive layers is formed of polycrystalline silicon.

11. A nonvolatile memory device according to claim 8, wherein said second conductive layer (51) includes a first pair of oppositely facing side edges and a second pair of side edges substantially perpendicular to said first pair of side edges; wherein said third conductive layer (49) has a U-shape with two parallel conductive lines surrounding said second conductive layer (51); wherein said third conductive layer (49) includes first and second step portions (49A) extending below a part of said second conductive layer (51); and wherein said first conductive layer (47) is formed in a direction substantially perpendicular to the two parallel conductive lines of said third conductive layer (49).

12. A nonvolatile memory device comprising:
first and second voltage lines each having a selectively set potential;
first and second gate control lines;
first, second and third MOS transistors serially connected between said first and second voltage lines, said first and third MOS transistors each having gates respectively connected to said first and second gate control lines and said second MOS transistor having a gate set in an electrically floating condition;
first and second capacitive means respectively connected between the gate of said second MOS transistor and the gates of said first and third MOS transistors; and
third capacitive means connected between the gate and drain of said second MOS transistor;
wherein said first gate control line and the gate of said first MOS transistor are formed of a first conductive layer (47), the gate of said second MOS transistor is formed of a second conductive layer (51) and said second gate control line and the gate of said third MOS transistor are formed of a third conductive layer (49);
and wherein said first and third conductive layers (47, 49) overlap at a crossing point and said second conductive layer (51) has a projection portion (51A) arranged between the first and third conductive layers (47, 49) at said crossing point to form said first and third capacitive means (64, 66).

13. A nonvolatile memory device according to claim 12 wherein a source region of said first MOS transistor and a drain region of said second MOS transistor are formed in the same semiconductor region, said second conductive layer overlapping said semiconductor region to form said third capacitive means.

14. A nonvolatile memory device according to claim 12, wherein each of said first, second, and third conductive layers is formed of polycrystalline silicon.

* * * * *